United States Patent
Kozasa et al.

(10) Patent No.: US 10,152,152 B2
(45) Date of Patent: Dec. 11, 2018

(54) ELECTRET ELEMENT AND MANUFACTURING METHOD THEREFOR, SENSOR, ELECTRONIC CIRCUIT, AND INPUT DEVICE

(71) Applicant: National Institute of Advanced Industrial Science and Technology, Tokyo (JP)

(72) Inventors: Takehito Kozasa, Tsukuba (JP); Manabu Yoshida, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 15/516,119

(22) PCT Filed: Sep. 29, 2015

(86) PCT No.: PCT/JP2015/077558
§ 371 (c)(1),
(2) Date: Mar. 31, 2017

(87) PCT Pub. No.: WO2016/052525
PCT Pub. Date: Apr. 7, 2016

(65) Prior Publication Data
US 2017/0329427 A1     Nov. 16, 2017

(30) Foreign Application Priority Data
Oct. 2, 2014   (JP) .................................. 2014-204038

(51) Int. Cl.
*G08B 6/00*   (2006.01)
*G06F 3/041*   (2006.01)
(Continued)

(52) U.S. Cl.
CPC ............ *G06F 3/041* (2013.01); *B81B 3/0021* (2013.01); *G01L 1/2293* (2013.01); *G01P 15/08* (2013.01);
(Continued)

(58) Field of Classification Search
CPC ....... G06F 3/041; H01L 41/1132; H01L 29/84
(Continued)

(56) References Cited

U.S. PATENT DOCUMENTS 3,835,264 A  *  9/1974  Overby ................. H04R 19/01
                                                      381/175
3,978,508 A       8/1976  Vilkomerson
(Continued)

FOREIGN PATENT DOCUMENTS

JP      S51-24884 A     2/1976
JP      S58-49036 B2    11/1983
(Continued)

OTHER PUBLICATIONS

International Search Report for PCT Serial No. PCT/JP2015/077558 dated Dec. 17, 2015.

*Primary Examiner* — Tai T Nguyen
(74) *Attorney, Agent, or Firm* — McCormick, Paulding & Huber LLP

(57) ABSTRACT

Provided are an element applicable to a high-precision, high-sensitivity pressure detecting sensor and switch, a manufacturing method for the element; and a sensor, an electronic circuit, and an input device that include the element. The electret element of the present invention has a semiconductor sandwiched between a pair of electrodes, and an electret film disposed at a location opposite to the semiconductor via a gap. The electret element of the present invention may be structured so that the semiconductor contacts with the electret film, or so as to have micro-sized
(Continued)

gaps therebetween. The electret film is semi-permanently kept in a positively or negatively charged state. By having a structure in which the electret film can contact with or approach the semiconductor, an amount of electric currents flowing between the pair of electrodes can be controlled.

18 Claims, 10 Drawing Sheets

(51) Int. Cl.
| | |
|---|---|
| H01G 7/02 | (2006.01) |
| H03K 17/955 | (2006.01) |
| H03K 17/975 | (2006.01) |
| G01P 15/08 | (2006.01) |
| G06F 3/01 | (2006.01) |
| G06F 3/0354 | (2013.01) |
| H01L 21/31 | (2006.01) |
| H01L 29/51 | (2006.01) |
| H01L 29/78 | (2006.01) |
| H01L 29/82 | (2006.01) |
| H01L 29/84 | (2006.01) |
| H01L 41/113 | (2006.01) |
| B81B 3/00 | (2006.01) |
| G06F 3/044 | (2006.01) |
| G01L 1/22 | (2006.01) |

(52) U.S. Cl.
CPC .......... *G06F 3/016* (2013.01); *G06F 3/03545* (2013.01); *G06F 3/044* (2013.01); *H01G 7/02* (2013.01); *H01L 21/31* (2013.01); *H01L 29/513* (2013.01); *H01L 29/78* (2013.01); *H01L 29/82* (2013.01); *H01L 29/84* (2013.01); *H01L 41/1132* (2013.01); *H03K 17/955* (2013.01); *H03K 17/975* (2013.01); *B81B 2201/0257* (2013.01); *B81B 2201/0264* (2013.01)

(58) Field of Classification Search
USPC .......................................... 340/407.02, 407.2
See application file for complete search history.

(56) References Cited

U.S. PATENT DOCUMENTS

| | | | |
|---|---|---|---|
| 6,383,832 B1* | 5/2002 | Nakabayashi | B81B 3/0086 |
| | | | 257/415 |
| 6,535,342 B1* | 3/2003 | Ghoshal | B82Y 10/00 |
| | | | 360/122 |
| 6,613,602 B2* | 9/2003 | Cooper | H01L 35/10 |
| | | | 257/930 |
| 2002/0047173 A1* | 4/2002 | Okawa | H04R 7/16 |
| | | | 257/415 |
| 2010/0328053 A1 | 12/2010 | Yeh et al. | |
| 2014/0192273 A1 | 7/2014 | Okuyama et al. | |
| 2015/0115331 A1 | 4/2015 | Moon et al. | |

FOREIGN PATENT DOCUMENTS

| | | |
|---|---|---|
| JP | 2008-109772 A | 5/2008 |
| JP | 2011-8749 A | 1/2011 |
| JP | 2013-217701 A | 10/2013 |
| JP | 2014-132422 A | 7/2014 |
| WO | 2013/168922 A1 | 11/2013 |

* cited by examiner

SEMICONDUCTOR
INSULATOR, BANK STRUCTURE BODY
ELECTRODE, WIRING
ELECTRET MEMBER

ELECTRET ELEMENT AND MANUFACTURING METHOD THEREFOR, SENSOR, ELECTRONIC CIRCUIT, AND INPUT DEVICE

CROSS-REFERENCE TO RELATED APPLICATIONS

This application is a National Stage application of International Patent Application No. PCT/JP2015/077558, filed on Sep. 29, 2015, which claims priority to Japanese Patent Application Number 2014-204038, filed on Oct. 2, 2014, each of which is hereby incorporated by reference in its entirety.

TECHNICAL FIELD

The present invention relates to: an electret element applicable to a high-precision, high-sensitivity pressure detecting sensor and switch; a manufacturing method for the electret element; and a sensor, an electronic circuit, and an input device each of which has the electret element.

BACKGROUND ART

Development of an input device such as a touch sensor has been in progress in recent years. For example, a capacitance type touch sensor is used in a touch panel etc., thereby enabling detection of input location information. An in-cell type touch panel, in whose display element a touch sensor is incorporated, and the like are also known.

By a research on prior art documents, the following documents have been found.

Proposed has been an array-type tactile feedback touch panel which includes: a touch control means; a vibrator such as an electret; a unit that causes such a vibrator on a track of movement to vibrate; and a display unit that displays a touch control screen (see Japanese Patent Application Laid-open No. 2011-8749).

Also, proposed has been a switching element which includes a p-channel transistor, and an electret film provided relatively movably thereto and capable of accumulating electric charges, and which uses electrostatic induction to control an ON-state and OFF-state of the p-channel transistor (see Japanese Patent Application Laid-open No. 2008-109772).

Further, proposed has been an input device, which includes: an operation panel having a plurality of conductive patterns crossing at right angles to each other; a (pen-like) pointer; and a position detecting means for measuring a potential due to electric charges generated in a plurality of conductive patterns by a charged part of the pointer in approach of the operation panel by the pointer and for detecting the position of the pointer based on the result of measurement of the potential, and in which an electret is used as the charged part of the pointer (see Japanese Patent Application Laid-open No. 2014-132422).

Moreover, proposed as a vibration detecting sensor device has been a device, whose sensor unit has: a vibration power-generating device for generating power through external vibration (an electret is used as one example); a power storage device for storing electric charges generated by the vibration power-generating device; and a determining unit for determining an amount of electric charges stored in the power storage device (see Japanese Patent Application Laid-open No. 2013-217701).

Additionally, proposed has been a no-contact type mechanism component in which: a gate electrode of a thin-film transistor is configured by an electret formed by polarizing a dielectric; the gate electrode is made movable freely to a gate insulating film; the channel conductance of the thin-film transistor is made changed by the movability; and an electric current between a source and drain is made variable (see Japanese Patent No. 58-49036).

SUMMARY

A conventional touch sensor has an element structure in which a stack structure of (an electrode)/(an active layer composed of a semiconductor, and a piezoelectric material, etc.)/(an electrode) is formed perpendicularly to a sheet substrate, and so precision of electrode alignment and deformation of bending etc. of a sensor device at manufacture of the element affect element performance greatly. Thus, improving the precision and sensitivity of the sensor is further desired.

Also, the capacitance type touch sensor used in a conventional touch panel etc. can detect the location information, but has a problem of enabling no detection of applied pressure. Meanwhile, the in-cell type touch panel etc., in which the touch sensor is incorporated in the display element, have a problem of making a manufacturing process complicated, and making its yield not improved. Further, there is also another problem of bringing an increase in manufacturing cost due to much use of a vacuum process, and a lithographic process, etc.

Moreover, a thinner, more flexible touch sensor device has been desired as an input device for portable electronic equipment etc.

The present invention is conceived in order to solve these problems, and its object is to provide: an element applicable to a thin, highly flexible pressure-detecting type touch sensor with high precision and high sensitivity; a manufacturing method for the element; and a sensor, an electronic circuit, and an input device that utilize the element.

In order to achieve the above object, the present invention has the following features.

An electret element according to the present invention is characterized by comprising: a semiconductor sandwiched between a pair of electrodes; and an electret film disposed at a location opposite to the semiconductor via gaps. Also, an electret element according to the present invention is characterized by comprising a stack structure including: a semiconductor sandwiched between a pair of electrodes; and an electret film disposed on a surface of the semiconductor device. Further, the electret element according to the present invention is characterized in that the electret film is semi-permanently kept in a positively or negatively charged state. The electret element according to the present invention is characterized in that an amount of electric current flowing between the pair of electrodes is controlled by approach of or contact with the semiconductor by the electret element, or by a change in a contact state. For example, in the electret element according to the present invention, the electret film is mounted on a substrate, and application of pressure or vibration to the substrate causes the electret film to change its position relative to the semiconductor, and the electret film to contact with or approach the semiconductor. For example, in the electret element according to the present invention, a gap holding portion that keeps the electret film and the semiconductor at a given interval is arranged on a part of a circumference of the semiconductor, and an interval between the gaps is variable depending on an external force.

Additionally, the electret element according to the present invention comprises a structure for eliminating noises.

Further, a manufacturing method for an electret element is characterized by comprising: forming, on one substrate, at least one of an electrode, a semiconductor, an electret film, and a gap holding portion; forming, on another substrate, at least the other which is not formed on the one substrate; and then overlapping the one substrate and the another substrate. Also, it is characterized in that the electret film is charged.

A sensor according to the present invention is characterized by comprising the electret element according to the present invention, in which the sensor measures an amount of electric current flowing between the pair of electrodes, and detects approach of or contact with the semiconductor by the electret film, or a change in a state of the contact.

An electronic circuit according to the present is characterized in that the electret film according to the invention is at least one or more in number, a wiring being connected to the electrodes.

An input device according to the present invention is characterized in that the electret film according to the present is at least one or more in number, and the input device detects a position, to which contact is subjected or pressure or vibration is applied, and inputs the position.

A novel structure and operational mechanism using the electret film and the semiconductor allow achieving a simply structured, high-precision thin-film element for detecting pressure.

According to the electret element of the present invention, since a gap between an electret surface, which has a high surface potential, and a semiconductor surface varies depending on applied pressure at a pressing time, and the applied pressure can be detected by utilizing a correlation between variance of the gap and conductivity of a conductive channel formed in the semiconductor. This enables highly sensitive pressure detection.

According to the electret element of the present invention, the conductivity of the conductive channel formed in the semiconductor contacting with the electret surface, which has a high surface potential, varies depending on the applied pressure at the pressing time etc., and the applied pressure can be detected by utilizing this variance. This enables highly sensitive pressure detection.

The electret element of the present invention makes it possible to increase in high sensitivity and high precision of a touch input device for an electronic device such as a touch panel. Also, the electret element of the present invention can be utilized in such a device as a pressure sensing sheet, a vibration detecting sensor, and a sound sensing microphone. Further, if a structure of the electret element is made of a flexible material(s), a thin-film flexible sensor device and a flexible input device having them as an input terminal(s) can be achieved.

Particularly, according to the electret element of the present invention, since an electric signal responds sensitively to a minute vertical displacement of the electret film, extremely weak touches by a pen, a brush, or the like, which is a difficult operation for a conventional touch panel to carry out, can be clearly distinguished. The element for a touch sensor with high precision and high sensitivity can be thus achieved.

The input device of the present invention can also detect a track of handwriting by a pen, a brush, or the like on a paper placed on the input device. Further, by applying the input device of the present invention to a draft, achieved can be a device that directly converts, into electronic data, a description onto a notebook or a paper memo, and a work such as a picture drawn on a canvas, and calligraphic work onto a standard-sized Japanese wiring paper, for example, an electronic scanner.

The electret element of the present invention is manufactured by: arranging a pair of electrodes and a semiconductor film on the same plane of one substrate; forming a conductive layer and an electret layer on the entire surface of another substrate; and pasting the respective substrates together, and so does not require high alignment precision in a manufacturing process. Therefore, the manufacturing process can be simplified, and an improvement in a yield and a reduction in the manufacturing cost are brought. Also, a printing process can be applied to the manufacturing process for the electret element according to the present invention, and so process cost can be reduced drastically as compared to conventional process cost.

According to the input device of the present invention, an array structure except and surrounding an electret element structure is structurally similar to a thin-film transistor array for driving a liquid crystal display currently in wide use, and so making the element high-density and high-definition can be achieved easily. Further, a trial for improving transmittancy of a display can be applied easily, and so a touch panel with higher transparency can be achieved.

BRIEF DESCRIPTIONS OF THE DRAWINGS

DETAILED DESCRIPTION

Figure 1:
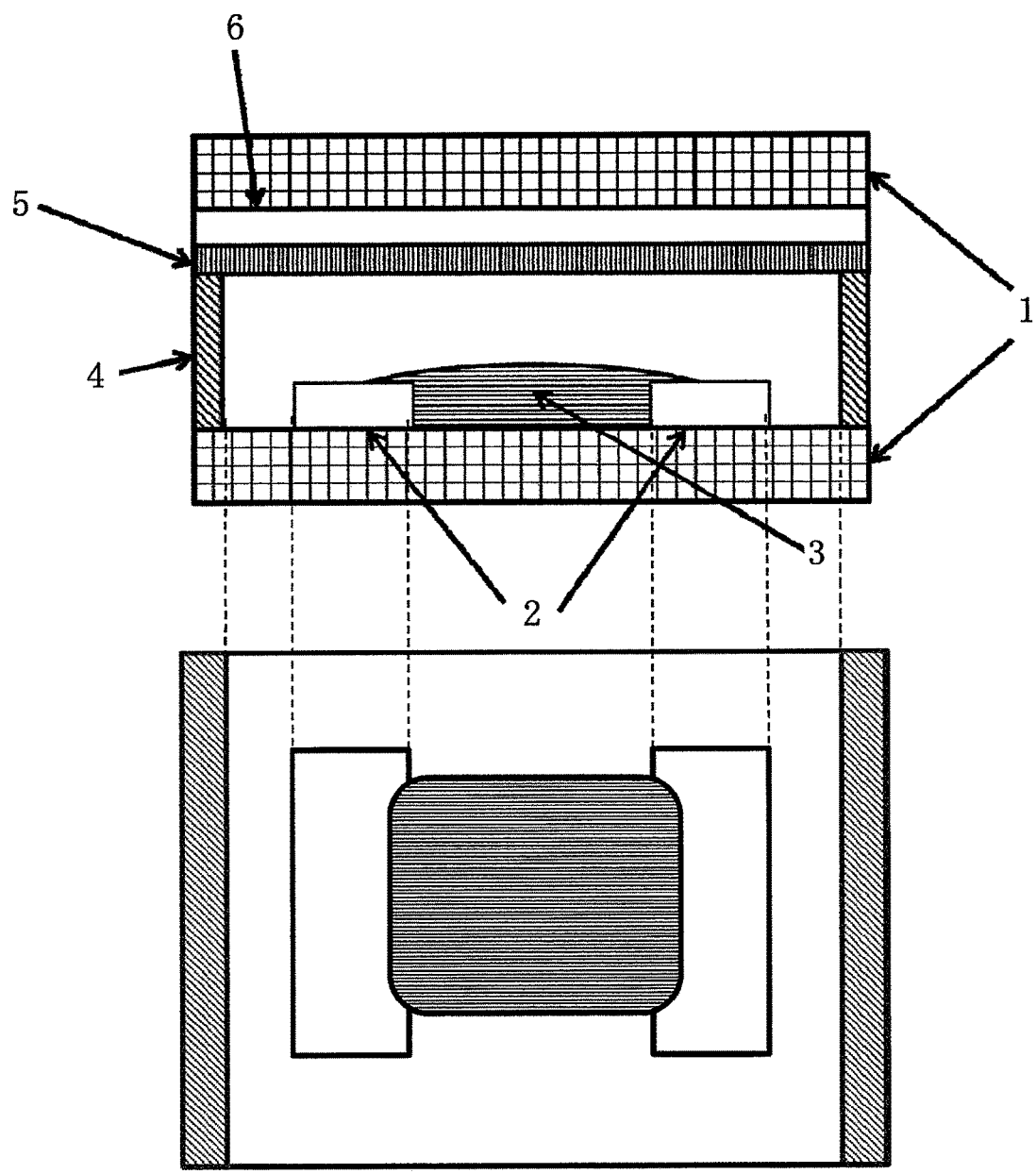
FIG. 1 is a conceptual diagram of an electret element according to a first embodiment.

Embodiments of the present invention will hereinafter be described.

An electret element according to an embodiment of the present invention includes: a semiconductor sandwiched between a pair of electrodes; and an electret film disposed at a location which is spatially opposite to the semiconductor and across a gap. When the electret film contacts with or approaches the semiconductor, channel charges are induced inside or on a surface of the semiconductor, and these channel charges control an amount of electric currents flowing between the pair of electrodes.

An electret element according to another embodiment of the present invention includes a stack structure which is composed of a semiconductor sandwiched between a pair of electrodes and an electret film, and which has no gap between the semiconductor and the electret film. When pressure or vibration is applied to the electret film, the channel charges induced inside or on the surface of the semiconductor are changed, and the amount of electric currents flowing between the pair of electrodes is controlled by the channel charges. As described in detail later, the electret element of the present invention may make the semiconductor and electret film contacting with each other to have a micro-sized gap(s) therebetween.

The embodiment of the present invention includes the electret film, and so can semi-permanently maintain its positively or negatively charged state, thereby enabling control of the amount of electric currents flowing between the pair of electrodes.

According to the embodiment of the present invention, the electret film is provided by film-forming, mounting, or the like it on a substrate. When pressure or vibration is applied to the substrate, a position of the electret film changes relatively to the semiconductor, and the electret film contacts with or approaches the semiconductor, thereby enabling the control of the amount of electric currents flowing between the pair of electrodes.

According to the embodiment of the present invention, a gap (also called opening) formed between the semiconductor and the electret film is in a vacuum state or a state filled with one, or two or more of dielectrics among a gaseous dielectric, a liquid dielectric, and such a solid dielectric as an organic polymer or an inorganic substance.

Provided to hold the gap is a gap holding portion for holding the electret film and the semiconductor and keeping them spatially spaced at a predetermined interval apart. The gap holding portion is provided on a part of a circumferential portion of the semiconductor, for example, further on each circumferential portion of the paired electrodes. The gap holding portion is formed, for example, by a bank structure body, or a depression formed on the substrate. The bank structure body can be formed by one, or two or more of a dielectric, a conductor, and a semiconductor.

The embodiment of the present invention preferably has a structure for eliminating noises. For example, a thin film or a structure body made of a conductor can be mounted or provided between the electret film and the substrate. The conductor can eliminate or suppress the noises. Also, a peripheral portion of the electret element may be provided with a noise-eliminating conductive structure or electronic component made of a conductor.

In a case where there is a fear for the contact with the electret film by the paired electrets, it is preferable to provide an insulating layer or semiconductor layer between the electret film and the electrodes and to thereby include a structure of having no contact between the electret film and the paired electrodes.

An already known resin; an organic material such as plastic; or an inorganic material can be used as the electret film. Used as the electret film can be any of fluorine-containing polymer; ethylene propylene fluoride; polytetrafluoroethylene; polyvinylidene fluoride; silicon oxide; silicon nitride; silicon oxynitride; copolymer of tetrafluoroethylen and other monomers; amorphous fluororesin (($C_6F_{100}$)n, etc.); para-xylene resin; polyimid; polyethylene terephthalate; polyamide; polycarbonate; polyethylene; polyvinyl chloride; polypropylene; polystyrene; polymethyl methacrylate; protein; DNA; cellulose; or a mixture and a layered body containing them.

It is preferable that the semiconductor of the present invention, which is sandwiched between the pair of electrodes, is one of or a mixture of two kinds or more of silicon, organic semiconductor, oxide semiconductor, and compound semiconductor. It is also preferable that the semiconductor is a P-type semiconductor, an N-type semiconductor, or a mixture of the P-type and N-type semiconductors. A PN junction is formed inside the semiconductor by stacking different kinds of semiconductors parallel or perpendicularly to the surface of the substrate or by existence of one semiconductor serving as a disperse element in another semiconductor, and such formation may bring an effect of improving response sensitivity or response speed to the pressure. If at least one of the above semiconductors is exchanged for a photo-sensitive semiconductor, it is also possible to manufacture an AND-type input device sensitive only to stimulation given by both pressure and light, for example, enabling an input only by an optical pen that emits light with a specific wavelength. This becomes a device resistant to external noises due to an AND-type input.

Used as the substrate can be such a resin with high general-purpose properties as polyethylene terephthalate or polyvinyl chloride; a film made of plastic etc.; or such an inorganic material as glass and silicon. The substrate on an electret film side needs to transmit, correspondingly to applied pressure, its pressure and bent state to the electret film, and so its material is desirably a flexible material such as a plastic film. The substrate sides of forming the semiconductor and the electrodes can use a plastic film or an inorganic material. The entire element can be also made flexible by using a flexible substrate.

In the element according to the embodiment of the present invention, at least one or more of an electrode, a semiconductor, an electret film, and a bank structure body or a depression structure are formed on one substrate while at least the other rest of the above which is not formed on the one substrate is(are) formed on another substrate. By overlapping or stacking these two substrates, the electret element according to the embodiment of the present invention is manufactured. Manufacturing processes of the electrodes, semiconductor, electret film, and bank structure body, etc. may be each formed through a printing process.

Already known various methods for charging the electret film can be adopted. Also, a voltage is applied between above a thin film or structure body of a conductor and above or on an electret film, which are the embodiment of the present invention, in order to charge the electret film.

Manufactured can be an electronic circuit which has one, or two or more electret elements according to the embodiment of the present invention and grasps, on the substrate, magnitude of pressure or vibration and a position where it has been detected. The substrate may be or may not be made common to the respective electret elements. Further, the electret film may be or may not be provided as a common film. Accordingly, an input device includes the above electronic circuit, and may enable an input of the position by applying contact, pressure, or vibration onto the substrate.

(First Embodiment)

A first embodiment will hereinafter be described in reference to the drawings. FIG. 1 is a conceptual diagram of an electret element of the first embodiment, in which its upper side is a sectional view and its lower side is a plan view corresponding to the sectional view. The present element has a basic structure including: a pair of electrodes 2; a semiconductor 3 sandwiched between the pair of electrodes 2; and an electret film 5 disposed at a location opposite to the semiconductor 3 via a gap so as to oppose a surface of the semiconductor. According to this embodiment, the pair of electrodes 2 and the semiconductor 3 are mounted on the lower substrate 1 on the upper side of the Figure, and a bank structure body 4 serving as a structure for providing the gap is provided at least at a circumference of the semiconductor and outside each periphery of the paired electrodes 2. The bank structure body 4 is provided on a part or the whole of an outer periphery of the electret film 5 so as to support the electret film 5 on its outer periphery. The electret film 5, a conductive thin-film 6, and the substrate 1 are provided by the bank structure body 4 so as to oppose to the substrate 1, on which the semiconductor is formed, and to maintain constantly the gap at no pressurization. Incidentally, the lower substrate 1 and the upper substrate 1 are formed separately. The conductive thin-film 6 is provided to eliminate noises such as electromagnetic waves generated from environment or peripheral electronic equipment.

In FIG. 1, the bank structure body 4 is provided to form the gap, but may be replaced with a different structure.

Figure 2:
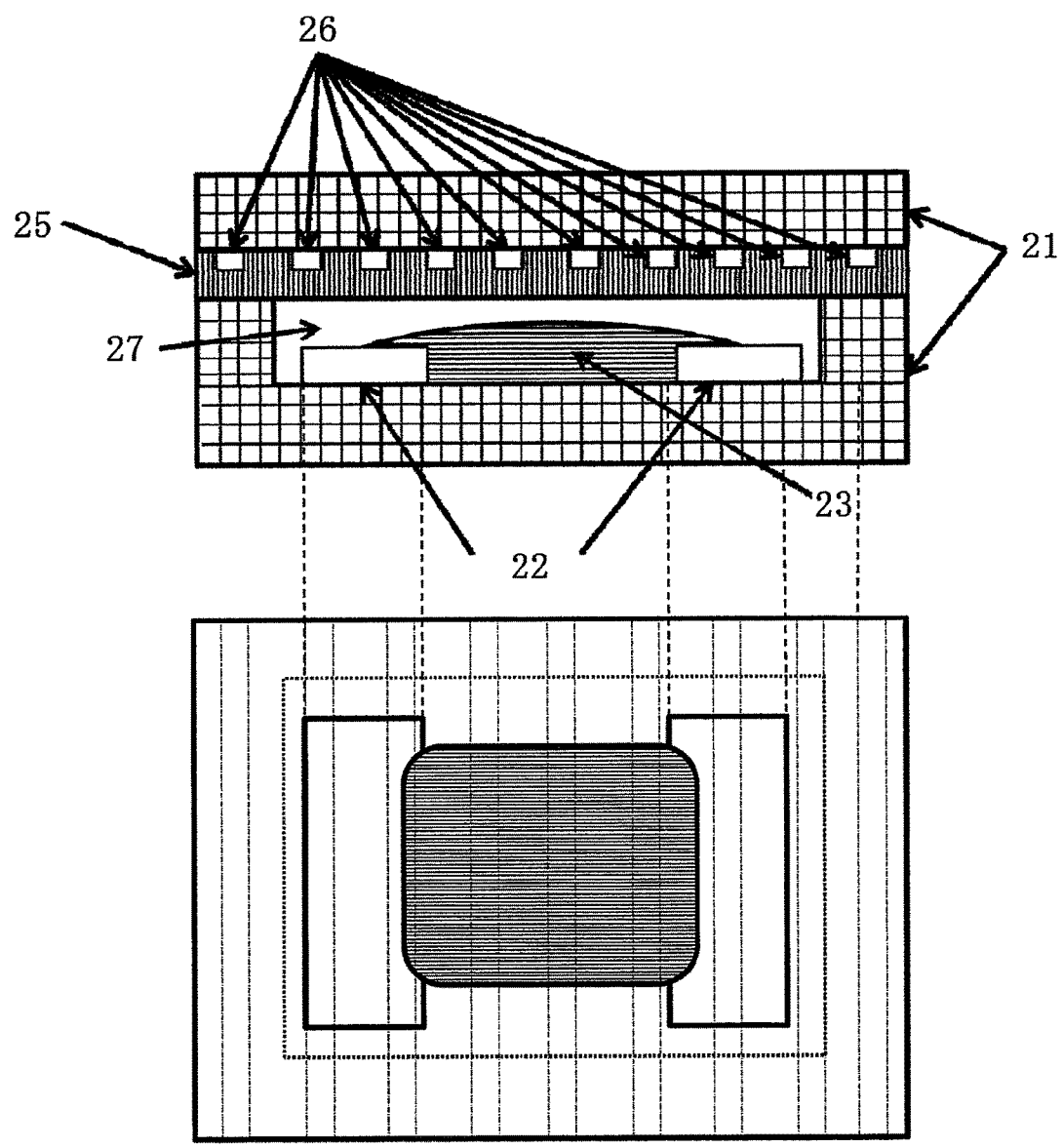
FIG. 2 is a conceptual diagram of a modified example of the electret element according to the first embodiment.

FIG. 2 depicts an example, in which a gap is formed by a depression 27 of a lower substrate 21 and in which its upper side is a sectional view and its lower side is a plan view corresponding to the sectional view in the same manner as in FIG. 1. In FIG. 2, a circumferential portion of the lower substrate 21 corresponds to the bank structure body of FIG. 1. The circumferential portion of the substrate 21 supports an electret film 25. In FIG. 2, a pair of electrodes 22 and a semiconductor 23 are placed in the depression 27 of the substrate 21, and thereby maintain the gap between each of them and the electret film.

In FIG. 2, a structure body 26 composed of conductors is provided in place of the conductive thin-film 6 of FIG. 1. As shown in FIG. 2, the structure body is not a thin film, but is composed of thin, elongated conductors parallel to each other, and provided between the electret film 25 and the upper substrate 21, thereby having a noise-eliminating effect.

Figure 3:
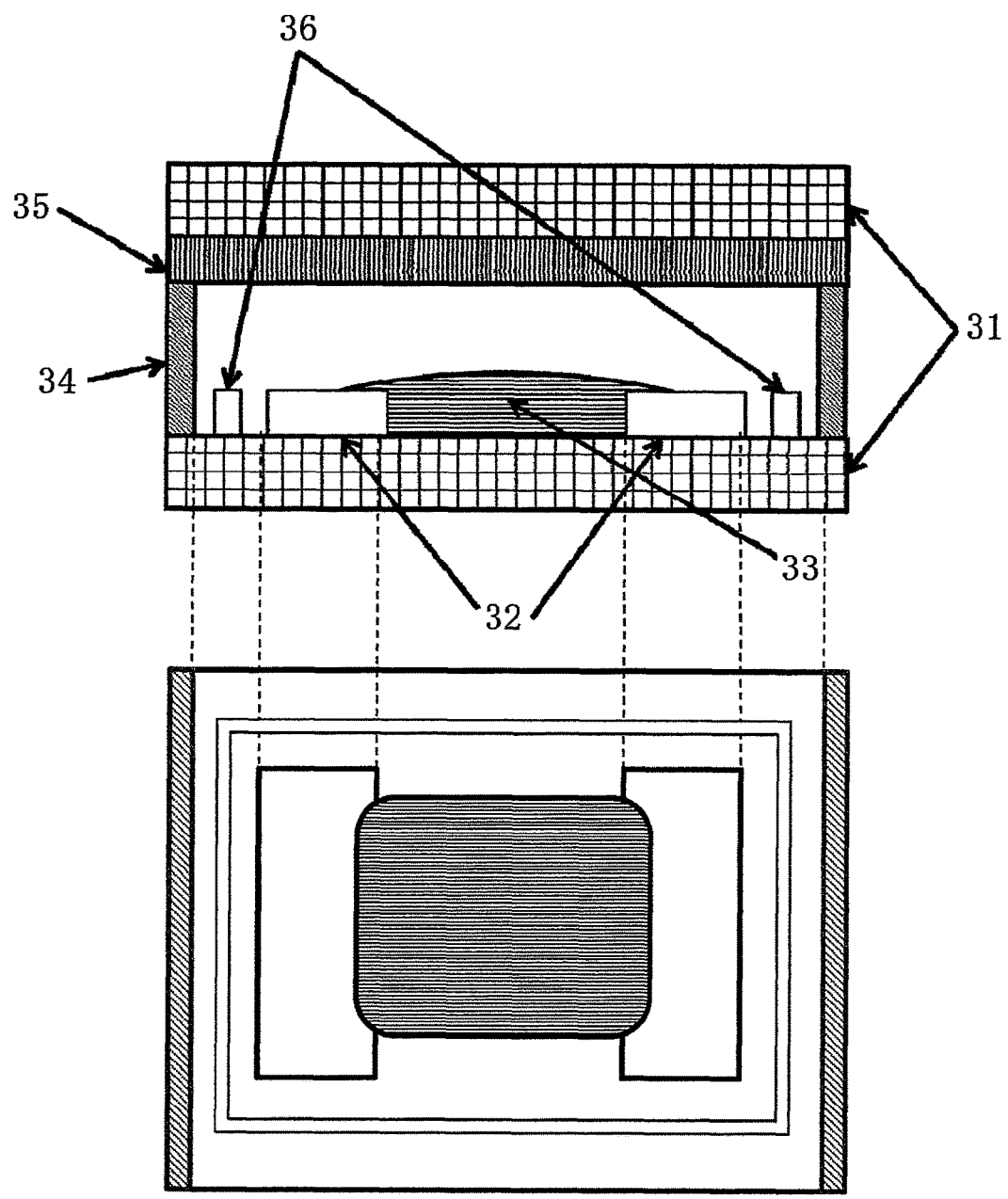
FIG. 3 is a conceptual diagram of a modified example of the electret element according to the first embodiment.

FIG. 3 depicts an example, in which a noise-eliminating portion is provided on a lower substrate and in which its upper side is a sectional view and its lower side is a plan view corresponding to the sectional view in the same manner as in FIG. 1. The electret element of FIG. 3 includes: a pair of electrodes 32; a semiconductor 33 sandwiched between the pair of electrodes 32; and an electret film 35 disposed at a location opposite to the semiconductor 33 across a gap. A noise-eliminating portion 36 is provided so as to encircle the paired electrodes 32 and the semiconductor 33 on a lower substrate 31. In FIG. 3, the noise-eliminating portion is provided along their entire circumference, but may be provided to a part of the circumference. In FIG. 3, similarly to a case of FIG. 1, a bank structure body 34 is provided at the circumference of the electret film to form the gap.

A plurality of examples have been described above as methods for noise elimination, but some of them may be used in combination.

Figure 4:
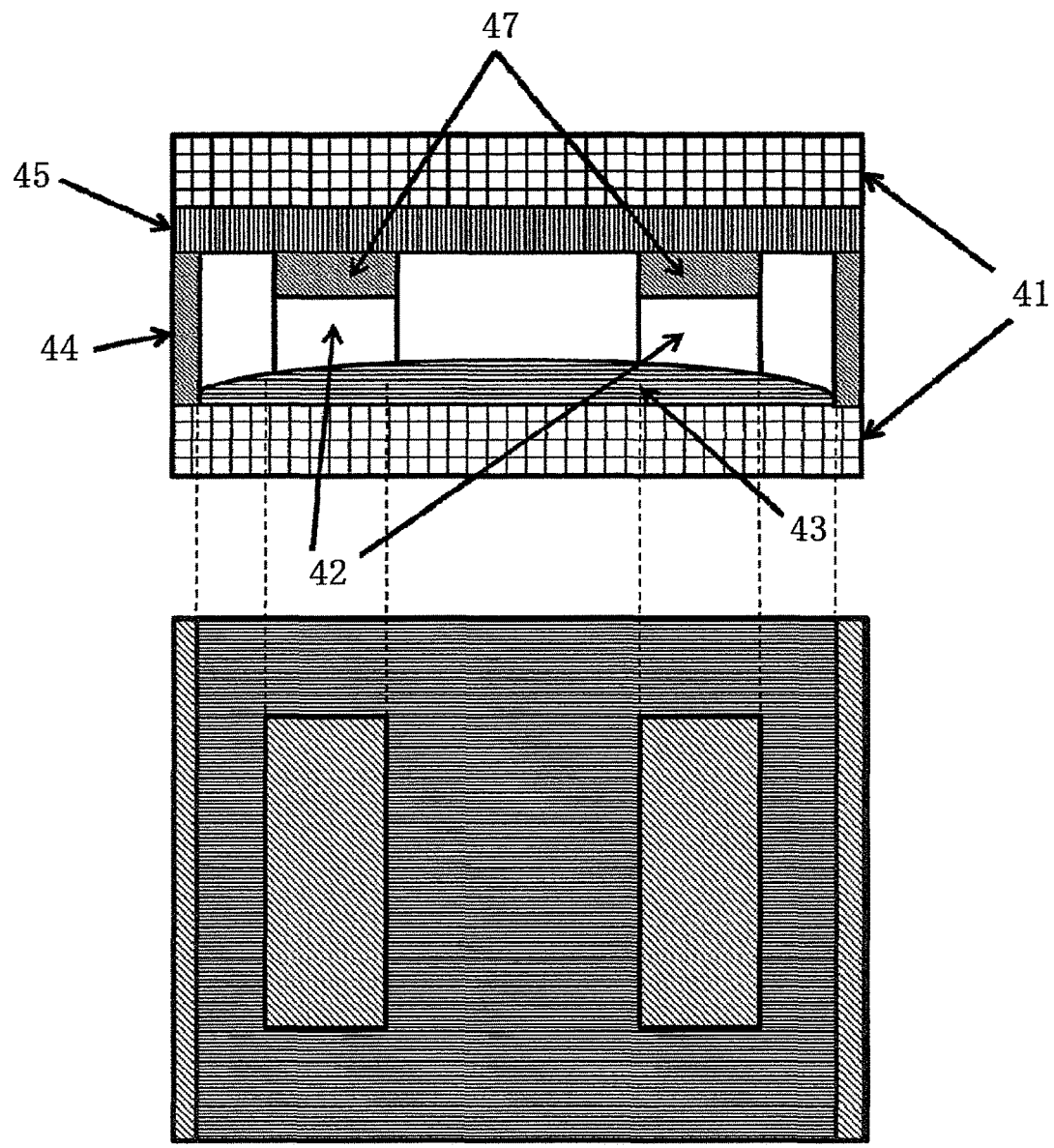
FIG. 4 is a conceptual diagram of a modified example of the electret element according to the first embodiment.

Examples of forming the electrodes on the substrate and then forming the semiconductor are depicted in FIGS. 1, 2, and 3. After the formation of the semiconductor, however, an electrode having such a shape as to overlap a part of or the whole of the semiconductor may be disposed on the semiconductor. FIG. 4 depicts an example in which a semiconductor 43 is provided on a lower substrate 41 and electrodes 42 are disposed on the semiconductor 43. FIG. 4 shows a structure in which a gap is formed by a bank structure body 44 and an electret film 45 is supported by the bank structure body to maintain the gap. Insulating layers 47 are provided so as to prevent the paired electrodes 42 from contacting with the electret film 45.

The element of the present embodiment is manufactured in the following manner. In a case of the basic structure shown on the upper side in FIG. 1, a film forming and disposing the paired electrodes 2 and the semiconductor 3 on the lower substrate 1, and a film forming and disposing, on the upper substrate 1, the electret film 5 via the conductive thin film 6 are pasted together so that the semiconductor 3 and the electret film 5 face each other and that the bank structure body 4 maintains the gap. The element is thus obtained.

The element of the present embodiment has been manufactured and its characteristics have been evaluated. Gold electrodes are formed on a glass substrate by a mask deposition method. An interval between the electrodes is set at 50 μm, and a width of the electrode is set at 5 mm. Subsequently, a solution obtained by dissolving poly 3-hexylthiophene serving as an organic semiconductor in an organic solvent is dripped between the electrodes, the solvent is dried and eliminated, and thereby the semiconductor thin-film is formed. Then, adhesive tapes are pasted outside the semiconductor thin-film formed on the substrate, and thereby the bank structure body is formed. Subsequently, a gold thin-film (equivalent to the conductive thin-film 6) is formed on a surface of a polyimide film by a sputtering deposition method, a thin-film of amorphous fluororesin ($(C6F100)n$) serving as the electret film is formed thereon. Further, a charging process is subjected to the thin-film of amorphous fluororesin ($(C6F100)n$) on the gold thin-film using a corona discharge device. Then, the glass substrate and the polyimide film are overlapped so that the thin-films formed on their surfaces face inwardly, and thereby the electret film is manufactured.

Figure 5:
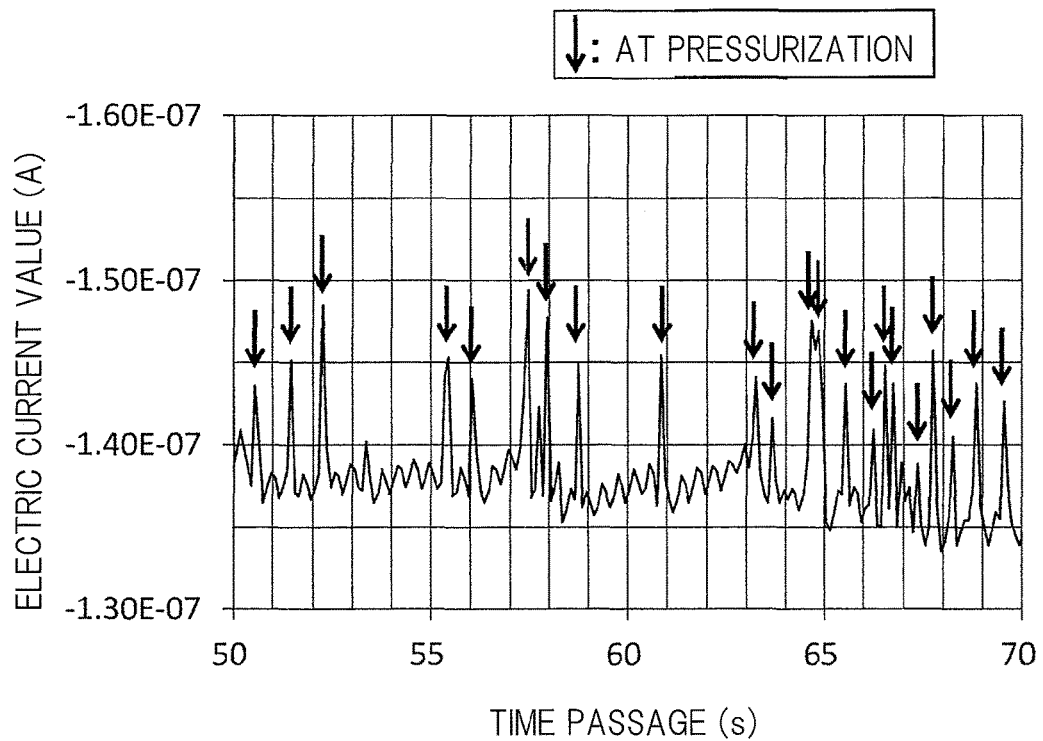
FIG. 5 is a characteristic diagram showing a relationship between pressurization and electric current values of the electret element according to the first embodiment.

A DC power supply and an ammeter are connected to the electrodes of the obtained element, and its current value is measured in such a state that a voltage of 40 V is applied thereto. FIG. 5 shows a change in electric current values at a time of pressurizing the film from above it by tweezers. Downward arrows indicate where it is pressurized with the passage of time on a horizontal axis. According to FIG. 5, as the electric current value rises by 5 to 10 nA at the pressurization, the element senses the pressurization in a real-time manner.

Figure 6:
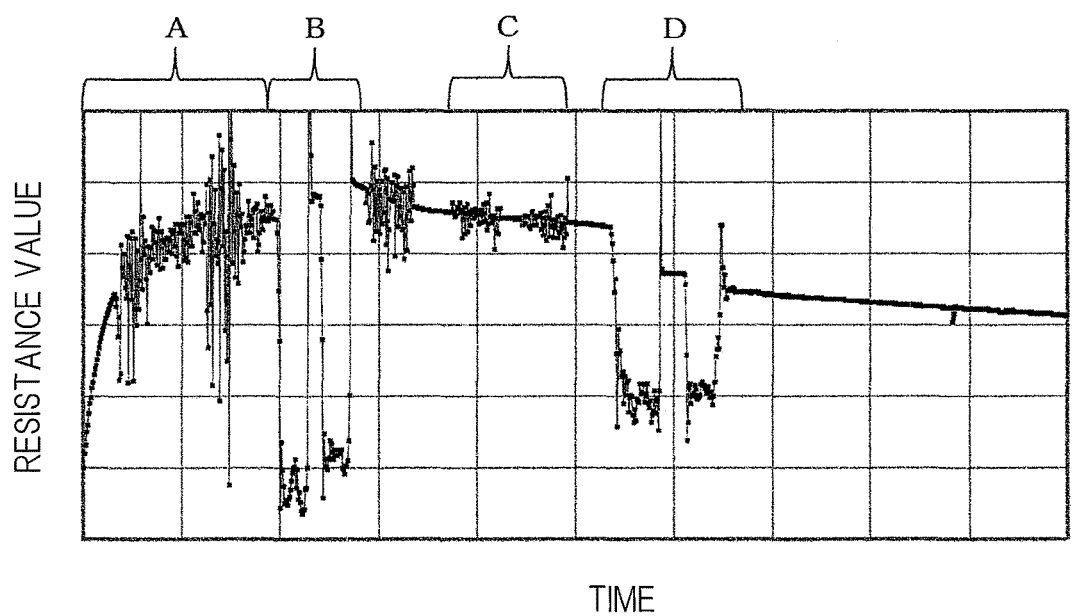
FIG. 6 is a characteristic diagram showing resistance values in being pressed by a plurality of different pressurizing methods.

FIG. 6 depicts resistance values when the element is pressed by a plurality of different kinds of pressurizing methods. "A" represents a resistance change due to vibration brought at pen-writing on a paper placed on a sensor of the electret element of the present embodiment. "B" represents a resistance change brought at push by the pen. "C" represents a resistance change brought at abrasion by a brush. "D" represents a resistance change brought at a push by a finger(s). It is understood from FIG. 6 that: the resistance change due to the vibration is high sensitive (see A); an amplitude of the resistance change at the push by the pen is extremely large and high sensitive; and the resistance change at the push by the finger(s) is also large (see D). FIG. 6 thus demonstrates that behavior of the change in the resistance values is different depending on differences in the pressurizing methods and the pressurized media. This leads to an understanding that the element senses not only presence/absence of the pressurization but also situations of the pressurization in detail.

Figure 7:
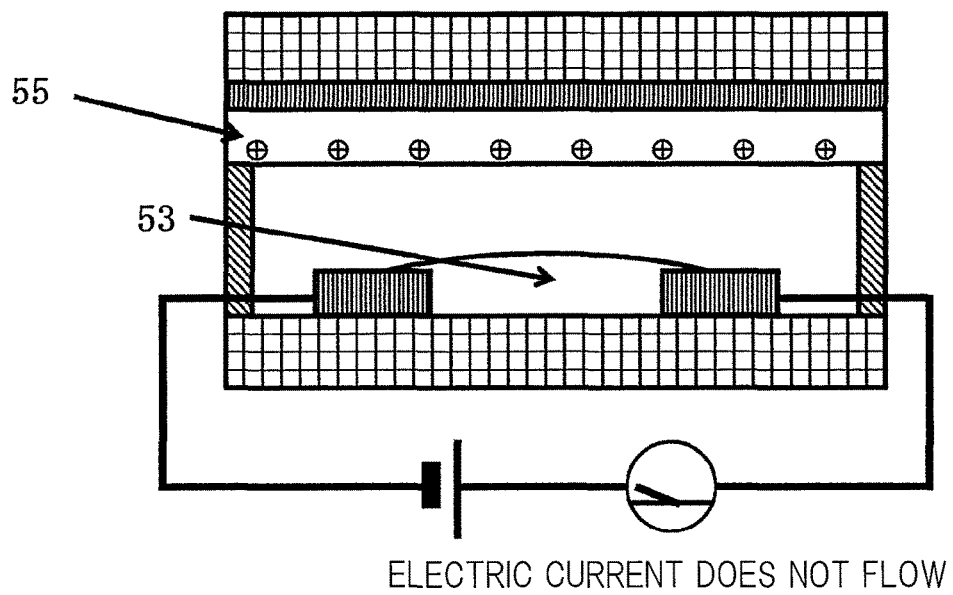
FIG. 7 is a diagram for explaining an operation principle of the electret element according to the first embodiment.
Figure 8:
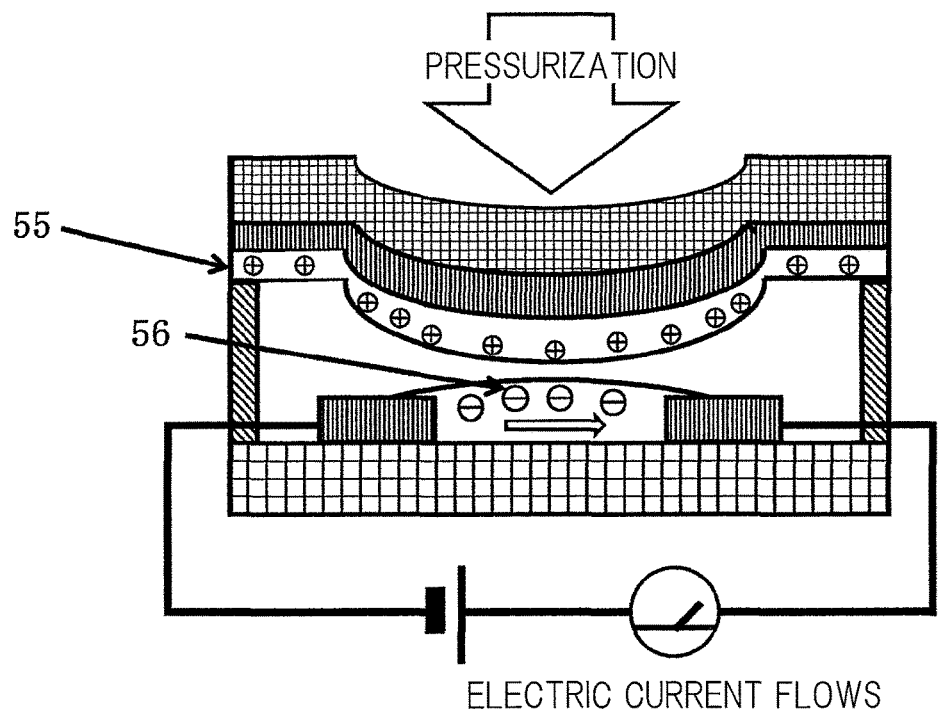
FIG. 8 is a diagram for explaining the operation principle of the electret element according to the first embodiment.

An operation principle of the element according to the present embodiment will be described in reference to FIGS. 7 and 8. FIG. 7 illuminates a sectional view of the electret element on no pressurizing state, and FIG. 8 illustrates a sectional view of the electret element on the pressurizing state. As shown in FIG. 7, a power supply and an ammeter are connected to the electrodes of the element, and a voltage is applied to the electrodes. Incidentally, an electret film 55 above a semiconductor (N-type semiconductor 53) is charged positively or negatively through a charging process before their overlap. The Figure illustrates an example charged positively. When no pressure is applied, no electric current flows. Next, as shown in FIG. 8, when the pressure is applied to the element from above, the electret film 55 approaches or contacts with the semiconductor (N-type semiconductor 53), and so the charged electret film 55 (positively charged in Figure) induces electric charges (carriers) in the semiconductor 53 (electrons 56 induced in the N-type semiconductor 53 in Figure) to form a channel. Through the formed channel, an electric current flows between the electrodes, and thereby inputs of signals are electrically detected. As described by FIGS. 7 and 8, the resistance value changes with high precision and high sensitivity based on such a phenomenon that the electric charges are induced in the semiconductor depending on the applied pressure to form the channel.

(Second Embodiment)

Figure 9:
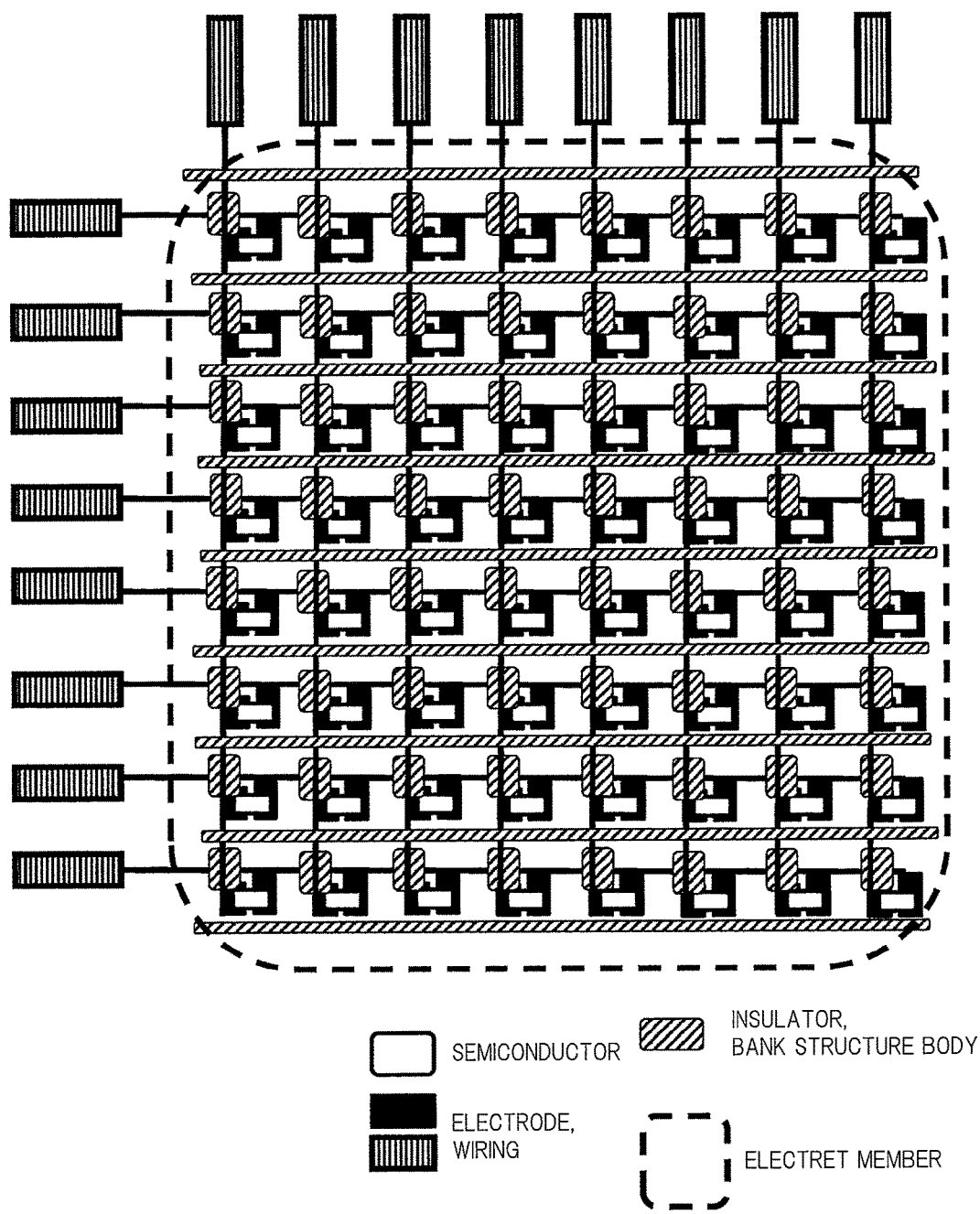
FIG. 9 is an explanatory diagram of an electronic circuit of an input device according to a second embodiment.

A second embodiment will hereinafter be described in reference to the drawings. According to the present embodiment, a plurality of the electret elements described in the first embodiment are provided, and presence/absence or magnitude of pressure or vibration applied to the electret film are detected through an electric current flowing between the pair of electrodes, so that a position of the detection is detected. A device of the present embodiment is suitable to an input device used in an electronic device such as a touch panel. FIG. 9 illustrates a schematically plan view of the device of the present embodiment seen from above. FIG. 9 is an example in which a plurality of the electret elements are arranged in a first direction and a second direction crossing the first direction (for example, at right angles) to form an array of the elements. FIG. 9 shows an example of an 8×8 matrix array circuit. Rows of independent wirings are provided in the first and second directions, and one of electrodes on both sides of each semiconductor is connected to the first-directional wiring while the other of the electrodes is connected to the second-directional wiring. In FIG. 9, the electret devices are each provided in an area encircled by dotted lines, and a gap with a given interval is provided between each semiconductor and each electret film. To form the gap, the bank structure body is properly provided on each wiring structure. When downward pressure is applied to the upper electret film opposite to the semiconductor between the electrodes, an electric signal from the semiconductor at the position of the pressurization can be detected efficiently. This input device detects the semiconductor subjected to a change in or ON/OFF of the resistance values, and thereby can detect the position where the pressure is applied.

(Third Embodiment)

Figure 10:
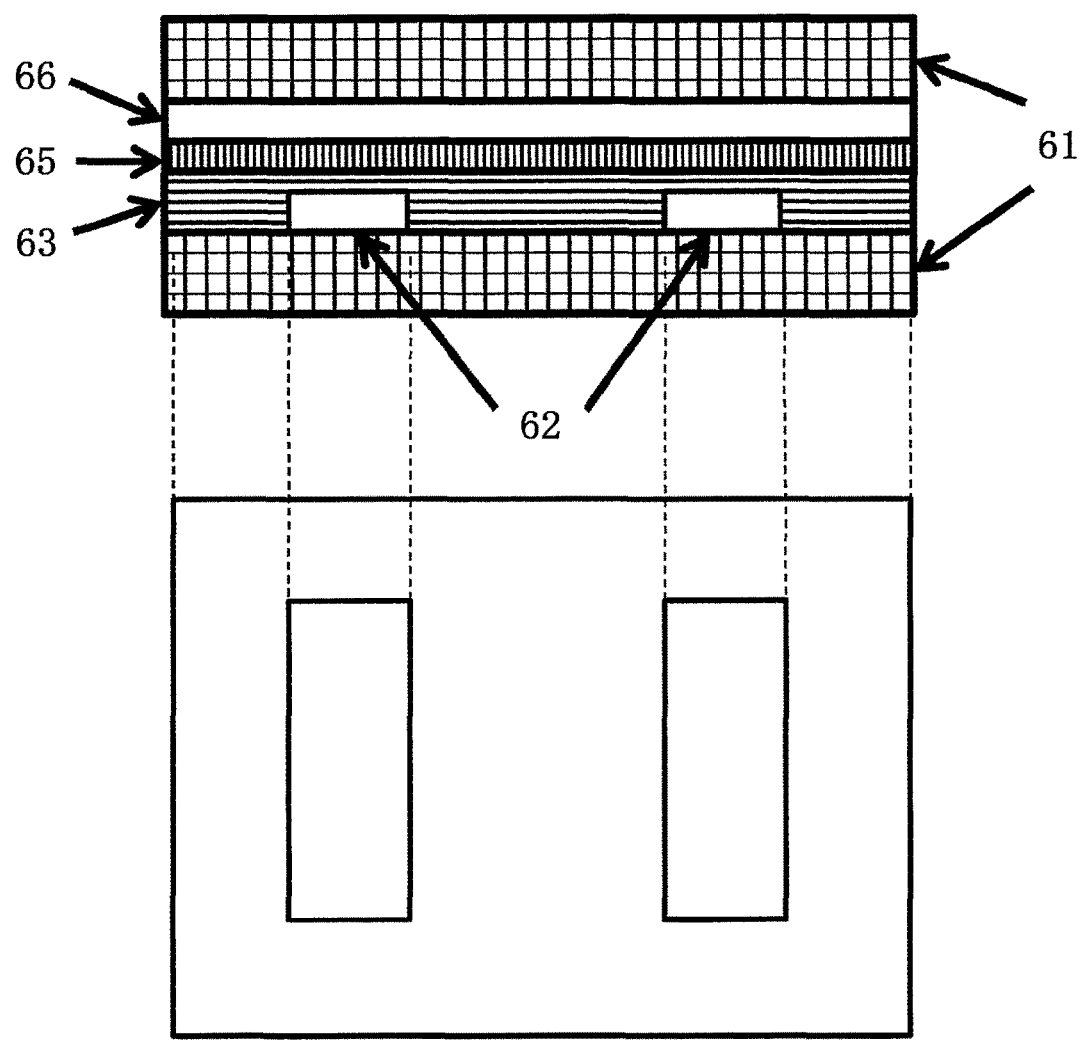
FIG. 10 is a conceptual diagram of an electret element according to a third embodiment.

According to a third embodiment, the gap holding portion such as the bank structure body on the electret element of the first embodiment is removed, and the semiconductor and the electret film make up a stack structure. The third embodiment will hereinafter be described in reference to the drawings. FIG. 10 is a conceptual diagram of an electret element of the present embodiment, in which its upper side is a sectional view and its lower side is a plan view corresponding to the sectional view.

An amount of electric charges induced in the semiconductor varies depending not only on a distance between the semiconductor and the electret film but also on a difference in force with which the electret film presses a semiconductor layer. Therefore, the amount of electric current flowing through the semiconductor lying between the electrodes can be controlled by changing the pressure applied to the electret film in such a state that the electret film contacts with the semiconductor layer.

The element shown in FIG. 10 has a stack structure composed of: a semiconductor 63 sandwiched between a pair of electrodes 62; and an electret film 65 disposed on a surface of the semiconductor 63. According to the element, the paired electrodes 62 and the semiconductor 63 are mounted on a lower substrate 61 shown on the upper side of FIG. 10, the semiconductor 63 is provided so as to cover the paired electrodes; and the electret film 65, a conductive thin-film 66, and the substrate 61 are stacked so that the surface of the semiconductor 63 contacts with and is superposed on the electret film 65. The paired electrodes 62 and the electret film 65 do not contact structurally with each other, and are isolated from the semiconductor 63. Incidentally, the lower side and the upper side of the substrate 61 are formed independently, and may be omitted appropriately. Similarly to the conductive thin-film of the first embodiment, the conductive thin-film 66 is a film for eliminating noises. The electret film 65 is just located on the surface of the semiconductor 63, and so an adhesive etc. are not used particularly. A structure for fixing the electret film and the semiconductor, etc. may be provided along the periphery of the element.

Figure 11:
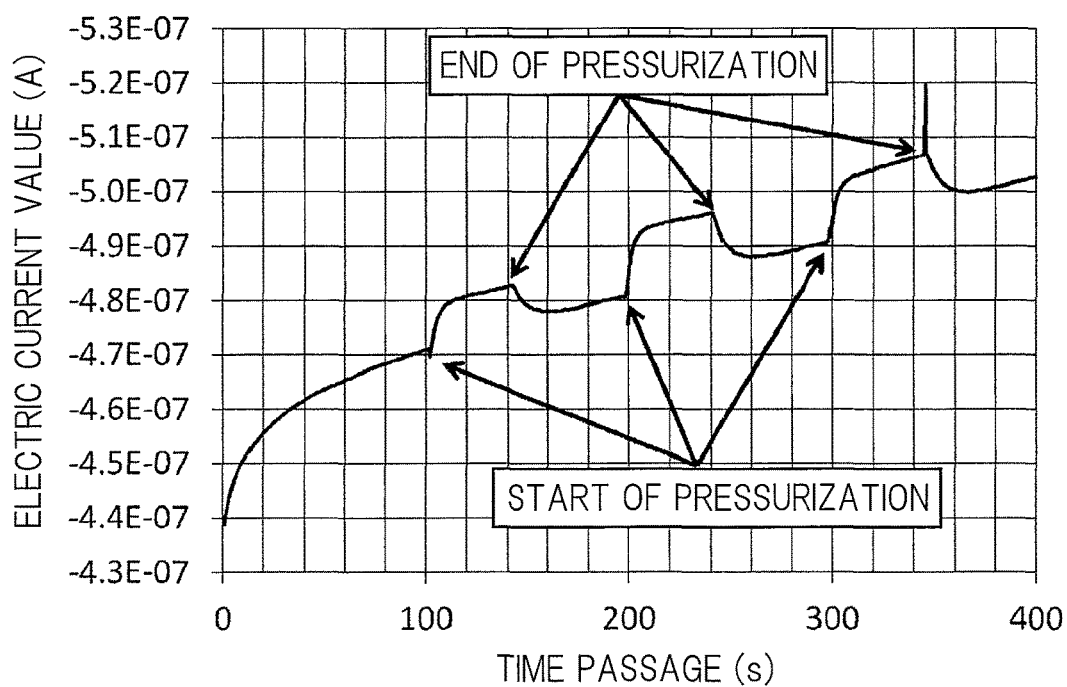
FIG. 11 is a characteristic diagram showing a relationship between pressurization and electric current values of the electret element according to the third embodiment.

FIG. 11 is a view showing a relationship between pressurization and values of electric currents flowing between the electrodes at a time of pressing the element having the structure of FIG. 10. Similarly to FIGS. 5 and 6, FIG. 11 demonstrates that the electric current value is increased by pressurization.

Figure 12:
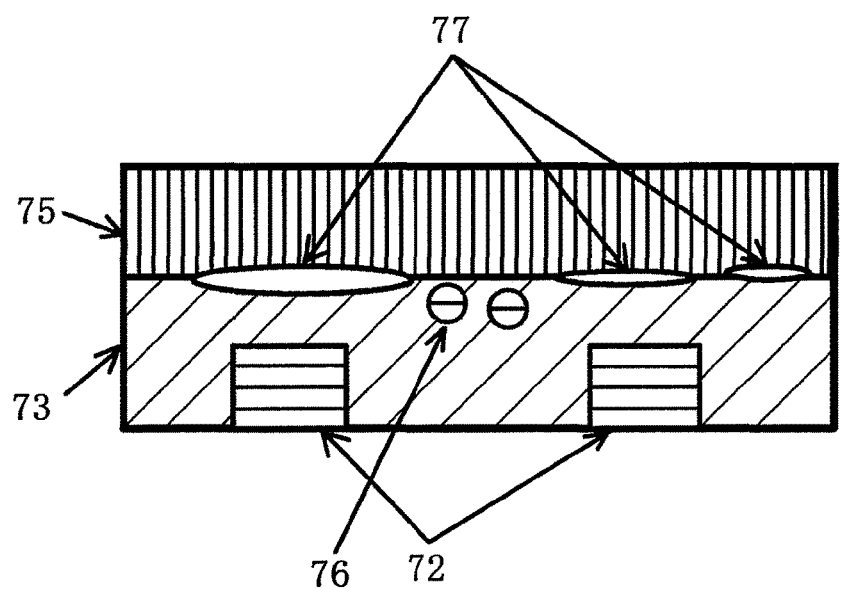
FIG. 12 is a diagram for explaining an operation principle of the electret element according to the third embodiment.
Figure 13:
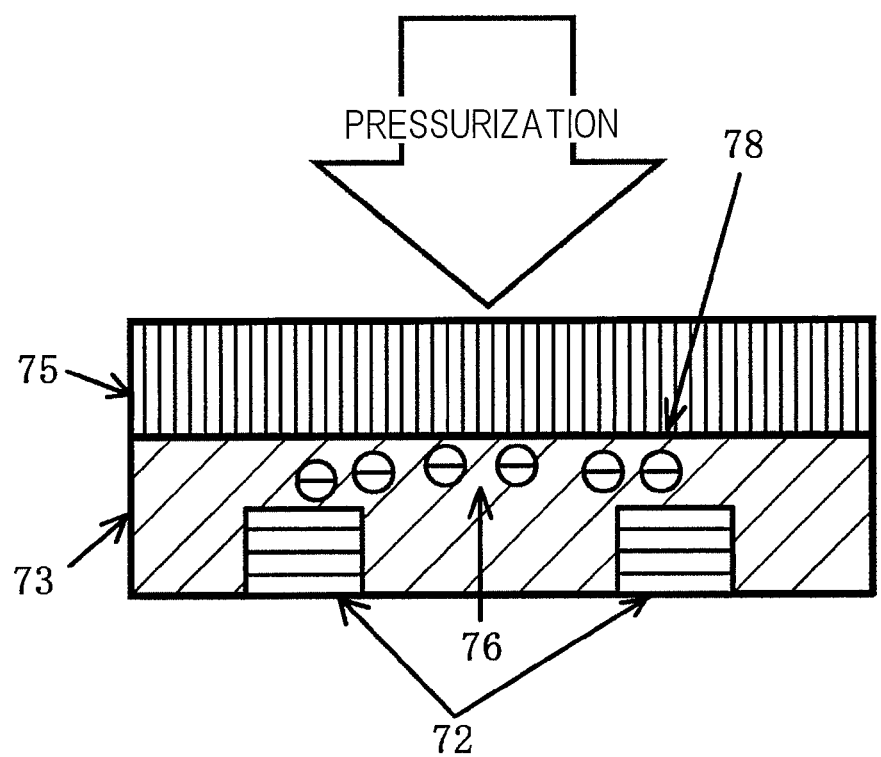
FIG. 13 is a diagram for explaining the operation principle of the electret element of the third embodiment at pressurization.

An operation principle of the element of the present embodiment will be described in reference to FIGS. 12 and 13. FIG. 12 is a sectional view of an electret element in a state of applying no pressure to the element, and FIG. 13 is a sectional view of the electret element in a state of applying pressure to the element. In the Figures, the electret element has a basic stack structure in which a semiconductor 73 having a pair of electrodes 72 and an electret film 75 are overlapped. In a case of having a stack structure in which the electret film and the semiconductor are overlapped with no gap therebetween, as shown in FIG. 12, micro-sized gaps (77 in the FIGURE), which are generated by unevenness and undulation on a surface of the film, are present on its overlapping portion. These micro-sized gaps 77 obstruct induction of carriers in the semiconductor (electrons 76 induced in the semiconductor in the Figure) due to the charged electret film. Next, as shown in FIG. 13, when pressure is applied to the element from above, the micro-sized gaps are crushed and disappear (78 in the FIGURE). This causes adhesion properties of the overlapping portion to be improved, the induction of the carriers to be promoted, and the electric current flowing between the electrodes to increase. A state of an increase in the induced electrons 76 is shown schematically in FIG. 13. The adhesion properties of the overlapping portion vary depending on the applied pressure, and so a resistance value between the electrodes vary in a high sensitive manner. Thus, even when the electret film contacts with the semiconductor, if the pressure or vibration is applied to the electret film, the state of contact changes, and so the amount of the electric current flowing between the pair of electrodes can be controlled.

By providing a plurality of elements of the present embodiment, the ON/OFF or magnitude of the pressure or vibration applied to the electret film is detected through the electric current flowing between the pair of electrodes, so that the position of the detection is detected. The sensor, the electronic circuit, and the input device using the elements of the present embodiment can be manufactured so as to have a structure similar to the structure of the present embodiment. When the element of the present embodiment is used, a bank structure body for maintaining the gap is unnecessary.

Examples described in the above embodiments etc. are ones for easily understanding the present invention, and are not limited to the embodiments.

The electret element according to the present invention can be applied to: an input device used in electronic devices such as a touch panel and microphone; a vibration sensor that detects deterioration and defect, etc. of structures such as roads, pipes, and walls; and a position sensor that is installed in roads and floors, etc. to sense actions of persons, and cars, etc., and so is useful in various industrial applications.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electret element comprising:
   a semiconductor sandwiched between a pair of electrodes; and
   an electret film disposed at a location opposite to the semiconductor via gaps,
   wherein an electric current flowing between the pair of electrodes with respect to a displacement of the electret film is detected, and at least a portion of an outer location of the pair of electrodes is provided with a protrusion portion made of a conductor.

2. The electret element according to claim 1,
   wherein the electret film is semi-permanently kept in a positively or negatively charged state.

3. The electret element according to claim 1,
   wherein an amount of electric current flowing between the pair of electrodes is controlled by approach of or contact with the semiconductor to the electret film, or by a change in a contact state.

4. The electret element according to claim 1,
   wherein the electret film is mounted on a substrate, and application of pressure or vibration to the substrate causes the electret film to change its position relative to the semiconductor, and the electret film to contact with or approach the semiconductor.

5. The electret element according to claim 1,
   wherein a gap holding portion that keeps the electret film and the semiconductor at a given interval is arranged on a part of a circumference of the semiconductor, and an interval between the gaps is variable depending on an external force.

6. The electret element according to claim 1,
   further comprising a structure for eliminating noises,
   wherein the structure is a protrusion portion made of a conductor and provided on a substrate, on which the pair of electrodes and the semiconductor are formed, so as to surround the pair of electrodes and the semiconductor.

7. A sensor comprising the electret element according to claim 1,
   wherein the sensor measures an amount of electric current flowing between the pair of electrodes, and detects approach of or contact with the semiconductor by the electret film, or a change in a state of the contact.

8. An electronic circuit comprising: the electret element according to claim 1; and
   a wiring that is connected to the electrodes,
   wherein the electret film is at least one or more in number.

9. An input device comprising the electret element according to claim 1,
   wherein the electret film is at least one or more in number, and the input device detects a position, to which contact is subjected or pressure or vibration is applied, and inputs the position.

10. An electret element comprising a stack structure including:
    a semiconductor sandwiched between a pair of electrodes; and an electret film disposed on a surface of the semiconductor layer,
    wherein an electric current flowing between the pair of electrodes with respect to a displacement of the electret film is detected, and at least a portion of an outer location of the pair of electrodes is provided with a protrusion portion made of a conductor.

11. The electret element according to claim 10,
    wherein the electret film is semi-permanently kept in a positively or negatively charged state.

12. The electret element according to claim 10,
    wherein an amount of electric current flowing between the pair of electrodes is controlled by approach of or contact with the semiconductor to the electret film, or by a change in a contact state.

13. The electret element according to claim 10,
    further comprising a structure for eliminating noises,
    wherein the structure is a protrusion portion made of a conductor and provided on a substrate, on which the pair of electrodes and the semiconductor are formed, so as to surround the pair of electrodes and the semiconductor.

14. A sensor comprising the electret element according to claim 10,
    wherein the sensor measures an amount of electric current flowing between the pair of electrodes, and detects approach of or contact with the semiconductor by the electret film, or a change in a state of the contact.

15. An electronic circuit comprising: the electret element according to claim 10; and
    a wiring that is connected to the electrodes,
    wherein the electret film is at least one or more in number.

16. An input device comprising the electret element according to claim 10,
    wherein the electret film is at least one or more in number, and the input device detects a position, to which contact is subjected or pressure or vibration is applied, and inputs the position.

17. A manufacturing method for an electret element, the method comprising:
    forming, on one substrate, at least one of an electrode, a semiconductor, an electret film, and a gap holding portion;

forming, on another substrate, at least the other which is not formed on the one substrate;

then providing a protrusion portion made of a conductor at an outer location of the electrode; and then overlapping the one substrate and the another substrate, wherein an electric current flowing between the pair of electrodes with respect to a displacement of the electret film can be detected.

18. The manufacturing method for the electret element according to claim 17, wherein the electret film is charged.

\* \* \* \* \*